United States Patent [19]

Marbot et al.

[11] Patent Number: 4,675,651
[45] Date of Patent: Jun. 23, 1987

[54] HIGH SPEED ANALOG DIGITAL CONVERTER OF THE DICHOTOMIZING TYPE

[75] Inventors: Roland Marbot, Saint Remy; Jean-Pierre Polonovski, Mareil Marly, both of France

[73] Assignee: Centre National de la Recherche Scientifique, Paris, France

[21] Appl. No.: 724,879

[22] Filed: Apr. 19, 1985

[30] Foreign Application Priority Data

Apr. 19, 1984 [FR] France ................................ 84 06233

[51] Int. Cl.[4] .............................................. H03M 1/44
[52] U.S. Cl. ........................ 340/347 AD; 340/347 M; 307/261; 307/262
[58] Field of Search .................. 340/347 AD, 347 M; 307/321, 256, 257, 261, 262

[56] References Cited

FOREIGN PATENT DOCUMENTS 1266962 3/1972 United Kingdom .
1601115 10/1981 United Kingdom .

OTHER PUBLICATIONS

Seely, Electron-Tube Circuits, McGraw-Hill Book Co., Inc., 1950, pp. 279-281.

Primary Examiner—T. J. Sloyan
Attorney, Agent, or Firm—Cesari and McKenna

[57] ABSTRACT

A dichotomizing, high speed analog - digital comprises an input stage for the voltage - current conversion of the analog signal, a reference current source, a sequence of N−1 identical cells in series, each comprising a comparator and current dividers, a terminal cell incorporating a comparator, a digital coder receiving a digital signal from each cell and, optionally, a link positioned between the consecutive cells. The analog signal is processed in the cells entirely in current form, the link means making it possible to isolate the potentials between successive cells.

14 Claims, 8 Drawing Figures

FIG. 8

HIGH SPEED ANALOG DIGITAL CONVERTER OF THE DICHOTOMIZING TYPE

BACKGROUND OF THE INVENTION

The present invention relates to a high speed N bit analog - digital converter of the dichotomizing type.

An analog - digital converter is an integrated circuit, which can be produced both with bipolar technology and with MOSFET, MESFET or JFET technology on a gallium arsenide or silicon substrate.

High speed analog - digital converters became available a few year ago and since then their use has spread widely aided by the general tendency of digitally processing analog signals. Fields of use for such converters are digital television, digital oscilloscopy and in general terms all the processing fields of high frequency signals (radar, displays, etc). These circuits make it possible to convert and sample at high frequency an analog signal.

Components are now available, whose sampling frequency can reach 20 MHz for circuit in MOS technology and 100 MHz for a circuit in bipolar technology. The resolution of known circuits is generally limited to 8 bits.

A conventional analog - digital conversion method consists of comparing a voltage signal V to be digitized with $2^N$ reference signals regularly distributed in the range $[V_o-V_{ref}, V_o+V_{ref}]$ of admissible voltages, N expressing the resolution in numbers of bits, followed by the encoding in a priority manner of the outpus of $2^N$ comparators in order to produce a digital signal of N bits.

This method leads to two limitations. On the one hand, the resolution rarely exceeds 8 bits, because such a resolution requires $2^8$ or 256 comparators. On the other hand the pass band is limited by the fact that is is necessary to distribute the input signal V over each of the comparators, which makes it necessary to use an external amplifier.

The performances of an analog - digital converter based on this method are also limited by difficulties of a technological nature in:

the realization of a very precise resistor network for producing the $2^N$ reference voltage signals, control of the offset of the comparators, which could otherwise lead to deficient codes, i.e. to the impossibility of supplying the given digital signal, no matter what the analog voltage V, and compromise between the speed and consumption of the comparators.

An analog - digital conversion method is also known giving performance levels comparable to the first method, while reducing the number of components thereof and consequently the consumption. This method utilizes the known dichotomy principle.

An analog - digital converter utilizing this method comprises a sample and hold circuit receiving the voltage signal V to be digitized, followed by N identical cells in cascade. Each cell comprises two elements, namely a comparator receiving at the input an analog signal $V_e$ and a reference signal $V_{ref}$ and an amplifier supplying a signal $V_s$ equal to $2 \times |V_e - V_{ref}2|$.

The signal $V_e$ received by a cell is the signal $V_s$ of the preceding cell and for the first cell it is the signal V. All the outputs of these comparators form the digitized value in Gray code of the sampled signal V.

However, this method is not without disadvantages. Thus, in each cell, the amplifier applies a gain 2 to the high frequency signal $V_e - V_{ref}2$, which is linked with the choice of the use of a single comparison threshold $V_{ref}2$ for all the cells. This method leads to a limitation of the performances of the converter, because the accuracy of the gain of each amplifier conditions the resolution of the converter in the complete pass band.

Moreover, the speed of the converter is dependent on the pass band of the amplifiers and on the total transit time of the N cells. Thus, it can be stated that while the information is being propagated up to the final bit, the input signal must vary by no more than the value of the least significant bit, which requires the use of a sample and hold circuit which, as from a certain speed threshold, introduces more performance limitations than the remainder of the converter means. Finally, the application of a precise gain 2 to a high frequency signal is difficult.

Dichotomizing analog - digital converters are known, in which the high frequency signal is not multiplied and in which, in fact, the reference signal, which is constant is divided by two in each cell. Such analog - digital converters are more particularly described in Britishp patent application Nos.1,266,962 and 1,601,115. They comprise a sequence of cells in cascade, each cell comprising a diode bridge, the comparison being carried out in each cell on current signals and no longer on voltage signals.

The construction of an analog - digital converter in which comparison takes place on the current signals is difficult, particularly with respect to the cascade arrangement of the cells. In the aforementioned patent applications, this difficulty is obviated by the use of an intermediate circuit operating in voltage between two consecutive cells.

However, another difficulty is that the output potentials of a cell are incompatible with the input potentials of the following cell. This problem is solved by the use, in alternating manner, of complementary cells. Thus, this solution implies the use, in the intermediate cell, of npn transistors for the conversion of the signal from the diode bridges of the cells of even order (for example) and pnp transistors for the conversion of the signal from the diode bridges of cells of uneven order.

This structure with complementary cells considerably limits the performances of the analog - digital converter on the one hand because the cutoff frequency of pnp transistors is only approximately 1 megahertz, whereas the cut-off frequency of npn transistors is approximately 1 gigahertz, and on the other hand because the current gain of pnp transistors is low (approximately between 1 and 30), which leads to a compensation problem of the basic currents of the transistors at the diode bridge input.

SUMMARY OF THE INVENTION

The invention relates to a dichotomizing analog - digital converter, which more particularly obviates the disadvantages of known analog - digital converters.

The converter according to the invention is characterized by the absence of a variable voltage and by a processing of the information solely in the form of an electrical current. This processing is made possible by the user of linking or connecting means arranged between two consecutive cells and serving to limit voltage swings. These connecting means make it possible to transmit the current signal from one cell to the next without transmitting voltages.

The processing of the signal in the form of a current without converting into a voltage between two cells makes it possible to use identical cells to and consequently eliminate the performance limitations caused by the use of complementary cells.

The present invention specifically relates to a high speed analog - digital converter for converting an analog voltage signal V contained in a voltage interval $[V_o-V_{ref}, V_o+V_{ref}]$ into a digital value of N bits, wherein the converter comprises an input stage for converting the signal V into a current i, which is a function of $V-V_o$ and for producing its opposite $-i$, a reference current source I, which is a function of $V_{ref}$ and its opposite $-I$, $N-1$ identical cells in series, each comprising two current dividers, a means for zero comparison and obtaining the absolute value and optionally a follower means, said cell receiving the currents $i_e$ and $I_e$ and their opposite $-i_e$ and $-I_e$ and supplying currents $i_s$ and $I_s$ respectively equal to $|i_e|-I_e:2$ and $I_e:2$, their opposite $-i_s$ and $-I_s$ and optionally a digital voltage signal, a terminal cell comprising a means for the zero comparison and for obtaining the absolute value receiving a current $i_e$ and its opposite $-i_e$ and at least one follower means, a digital coder receiving the digital voltage signals supplied by the cells and supplying N binary signals $b_1 \ldots b_N$ representing the digitized value of the analog voltage signal V, and a number n of connecting or linking means, in which $0 \leq n \leq N-1$, each of said means being positioned between two consecutive cells for transmitting the current $i_s$ supplied by one cell to the following cell, while isolating the potentials of the means for zero comparison and obtaining the absolute value of said cell.

$|i_e|$ designates the absolute value of the quantity $i_e$. The function of the linking means is to limit the voltage swings in the converter. The number of linking means can be zero, particularly in the case of a small number of cells. In the special case where N is equal to 1, the converter is a high speed analog comparator.

In a preferred manner, the comparison means of each cell comprises a diode bridge, whose high and low potential points, i.e. respectively the node of the bridge connected to the cathode of two diodes and that connected to the anode of two diodes are at fixed potentials $V_U$ and $V_D$, which prove $V_U-V_D<2 \cdot V_S$, in which $V_S$ is the threshold voltage of a diode of the bridge and whose input points, i.e. the two symmetrical nodes of the bridge, respectively receive a current $i_e$ and its opposite $-i_e$, the result of the zero comparison being indicated by the potential of one of the input points and the currents $|i_e|$ and $-|i_e|$ respectively appearing at the low and high potential points of the bridge.

Said means carries out a very fast, very accurate, analog zero comparison in a time of appoximately 1 nanosecond. The means comprises passive elements and consequently consumes no current. The recuperation of the potential of one of the input points, which determines the result of the comparison, necessitates a transistor, i.e. an active element. However, the consumption of said means remains very low.

According to a preferred embodiment of the converter according to the invention, the diodes of the bridges are of the Schottky type. These diodes have the advantage of a low threshold voltage, which makes it possible to limit the voltage swings in the converter and of having no charged storage phenomenon.

According to another feature, a voltage difference $V_U-V_D$ is chosen between the high and low points of a diode bridge equal to the threshold voltage $V_S$ of one diode of the bridge, which also helps to limit the voltage swings.

Finally, current mirrors are provided in each linking means for transmitting between adjacent cells the analog currents without transmitting the potentials.

According to a first embodiment, the converter according to the invention comprises $N-1$ linking means inserted between the N cells.

The potential at an input pont of the diode bridge of each cell can then have two values, which are linked with the potentials $V_U$ and $V_D$, one of these values corresponding to $i_e>0$ and the other to $i_e<0$.

The digital coder then receives N binary voltage signals supplied by N follower means of the cells, each of these signals corresponding to one potential state of the input point of a diode bridge of a cell.

According to a second embodiment, the converter according to the invention comprises a linking means between each cell of even order and the following cell. The input points of the diode bridge of one cell of even order are then directly connected to the high and low points of the diode bridge of the cell of the preceding order.

In this converter, the potential at one input point of a diode bridge of even order can assume four values. The potential at this point can consequently be represented by the digital coder by two binary signals. One of these signals indicates the sign of the current $i_e$ and the other the sign of the current $|i_e|-I_e:2$. Thus, the digital coder receives quadrivalued signals from each follower means of the cells positioned upstream of a linking means.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Throughout the remainder of the text, the means for the zero comparison and obtaining the absolute value of a current is merely referred to as comparison means for short.

Figure 1:
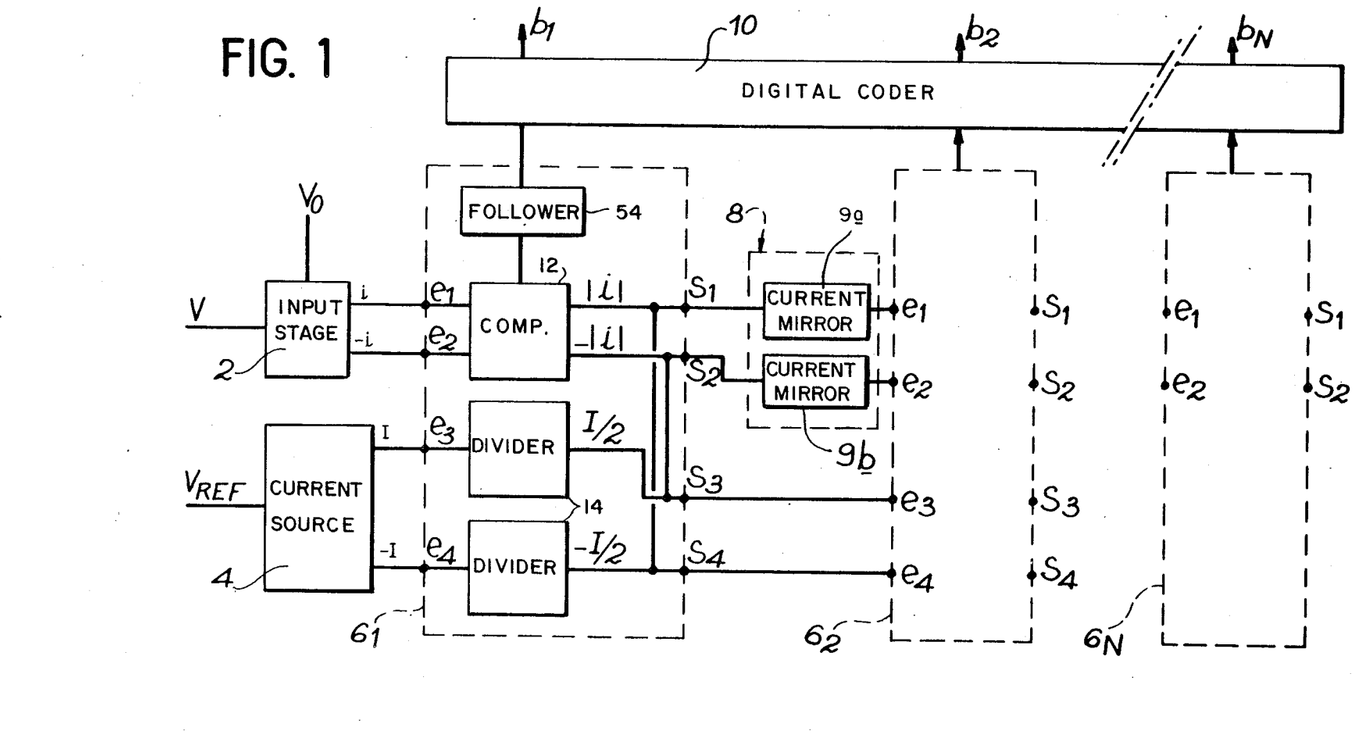
FIG. 1 a diagrammatic representation of an analog - digital converter according to the invention.

FIG. 1 is a diagrammatic view of the analog - digital converter according to the invention. It comprises an input stage 2, a current source 4, a sequence of identical cells $6_1, 6_2 \ldots 6_{N-1}$, a terminal cell $6_N$, one or more linking or connecting means 8 between two consecutive cells and a digital coder 10.

The converter according to the invention comprises a group of identical cells in cascade arrangement, each cell supplying a bit. The juxtaposing of the bits supplied by the cells forms a digital signal, whereof the value represents, in Gray code, the digital value associated with the analog signal received.

It should be noted that the converter according to the invention can be used as a frequency multiplier. Thus, on applying to the input a periodic triangular signal of frequency f, the binary signal supplied by the nth cell is a periodic signal of frequency nf.

The analog - digital converter of FIG. 1 supplies a digital signal of N bits $b_1, b_2 \ldots b_N$ corresponding to the analog signal received, each cell contributing one bit to the digital signal supplied. At the input, input stage 2 receives the analog voltage signal V to be digitized, which belongs to the interval $[V_o - V_{ref}, V_o + V_{ref}]$. Input stage 2 supplies an analog current i and its opposite −i, as a function of the amplitude of voltage signal V relative to $V_o$. The current source 4 supplies a reference current I and its opposite −I, whose intensity is equal to the current signal which would be supplied by voltage source 2, if the voltage signal received at the input was equal to $V_{ref}$. These four current signals are applied to the four inputs of the first cell $6_1$.

this cell, like each of the other cells, with the exception of the terminal cell, has four imputs $e_1, e_2, e_3$ and $e_4$ and four outputs $s_1, s_2, s_3$ and $s_4$. Each of the N−1 first cells receives at its input $e_1$ an analog current and at its input $e_2$ the opposite analog current, at its input $e_3$ a reference current and at its input $e_4$ the opposite reference current.

Each of the N−1 first cells comprises three processing means, namely a comparison means 12, two current dividers 14 and optionally a follower means 54.

Each of the N−1 first cells performs the transfer function $i_s = |i_e| - I_e : 2$, in which the subscripts e correspond to the currents received at the input of the cell and the subscript s corresponds to the current supplied by the cell. Each divider 14 has as its transfer function $I_s = I_e : 2$ in which e represents the signal received at the input and s the signal supplied at the output. The group of dividers of the N−1 first cells can be simply realised by two resistor networks R/2R, each network producing a sequence of currents, whose intensities are in geometrical progression at a rate of ½.

The terminal cell only comprises a comparison means 12 and at least one follower means 54, but no current divider. It only has two inuts $e_1$ and $e_2$ receiving an analog current $i_e$ and its opposite $-i_e$.

For each of the first N−1 cells, the comparison means 12 has two inputs connected to two inputs $e_1$ and $e_2$ of the cell and has two outputs connected to outputs $s_1$ and $s_2$ of the cell. Each divider 14 has an input connected to input $e_3, 3_4$ of the cell and an output connected to output $s_3, s_4$ of the cell.

Figures 5, 6, 7:
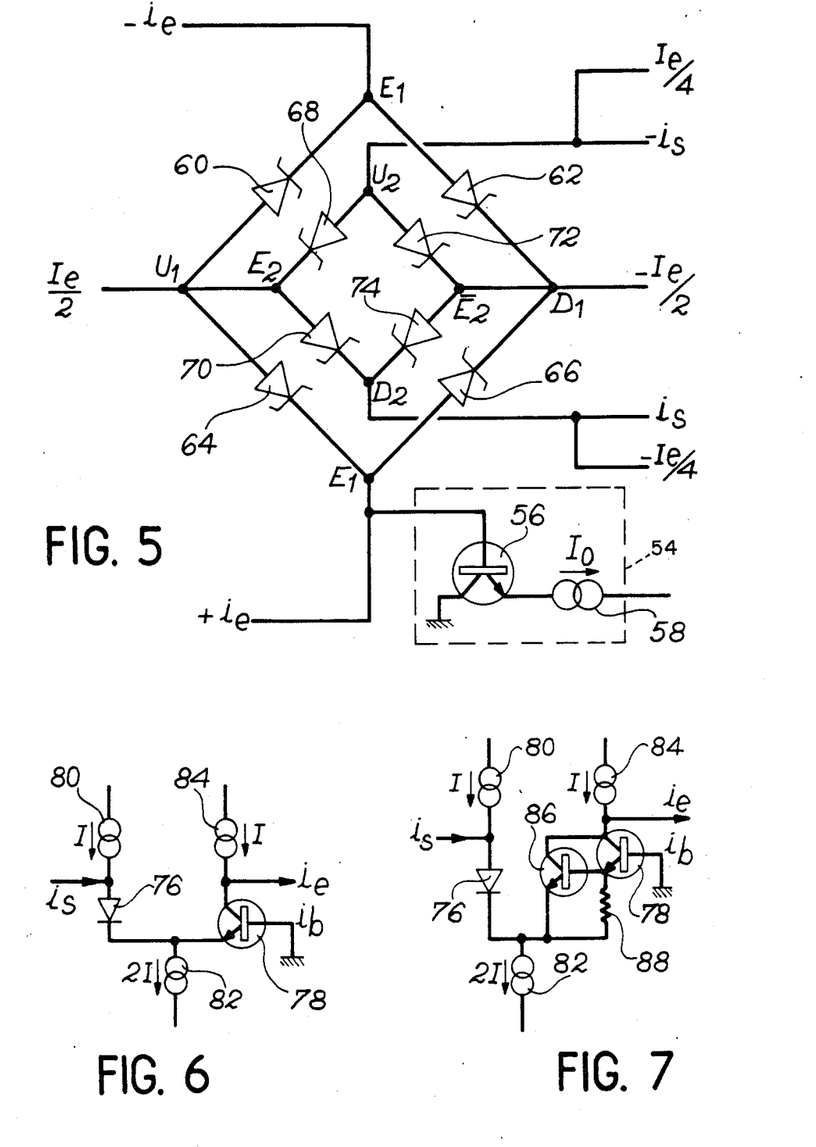
FIG. 5 the cascade arrangement of two cells of the converter, without any linking means between them.
FIG. 6 a current mirror of a linking means according to a first embodiment.
FIG. 7 a current mirror of a linking means according to a second embodiment.

The cells are arranged in cascade manner, ie.e the output $s_1$, in which $1 \leq i \leq 4$, of one cell is connected to the input $e_i$ of the following cell. This connection can be direct, or via a linking or connecting means 8. With reference to FIG. 5, an embodiment of the converter according to the invention will be described, in which two successive cells are directly cascaded with no linking means between them.

The linking means 8 makes it possible to limit the voltage swings between the different cells. It comprises two means 9a, 9b respectively positioned between output $s_1$ and $s_2$ of one cell and iputs $e_1$ and $e_2$ of the following cell. Outputs $s_3$ and $s_4$ of one cell are directly connected to the inputs $e_3$ and $e_4$ of the following cell.

The terminal cell and at least each cell among the N−1 first cells preceding a linking means also comprise at least one follower means 54 which supplies the digital coder 10 with a digital voltage signal, which is the function of the potential of one node of the comparison means of said cell. All the signal supplied by the cells to the digital coder constitutes a digital coding of the analog voltage V. Digital coder 10 performs a coder conversion of these signals in order to supply a digital signal with N bits representing the level of the analog voltage V.

A detailed description will now be given of the elements of the analog - digital converter and which can in bipolar technology. These figures can be integrally transposed with field effect transistors (FET).

Figure 2:
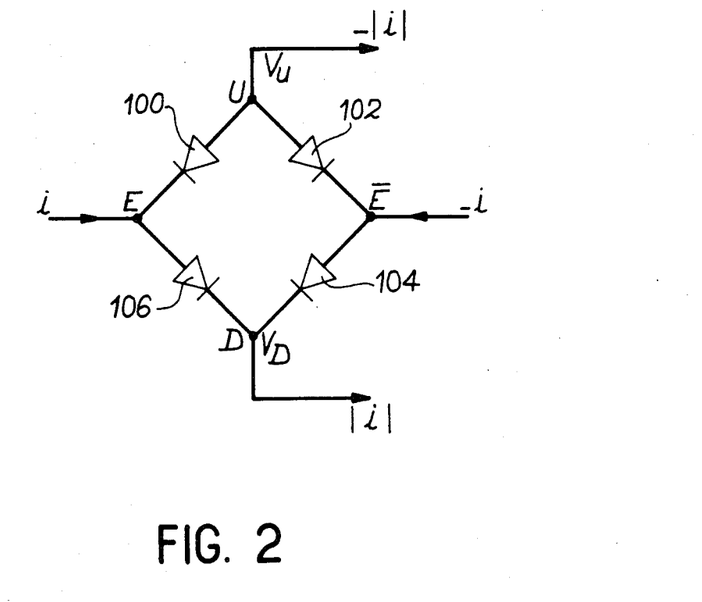
FIG. 2 the operation of the means for zero comparison and for obtaining the absolute value of a current from each cell of the converter of FIG. 1.

The comparison means shown in FIG. 2 is a diode bridge 100, 102, 104 and 106. The input points E and $\overline{E}$ of the bridge respectively receive an analog current i and its opposite −i. The high and lower potential points U, D respectively, which are respectively the node connected to the cathodes of the two diodes and the node connected to the anodes of the two diodes are at fixed potentisl $V_U$ and $V_D$. Currents $-|i|$ and $+|i|$ respectively appear at these points. Thus, this circuit makes it possible to effect the absolute value of a current.

It also gives information on the sign of current i. We will assume that current i is positive, so that diode 106 is conductive and potential $V_E$ of the input point E is equal to $V_S + V_D$, in which $V_S$ is the threshold voltage of diode 106. However, if the current i is negative, diode 100 is conductive and the potential of point E is equal to $V_U - V_S$.

The potential of input point E can thus assume two values corresponding on the one hand to a positive current i and on the other to a negative current i.

It should be noted that the input point $\overline{E}$ can assume the same values as input point E. Its potential is the complement of that of E.

Figure 3:
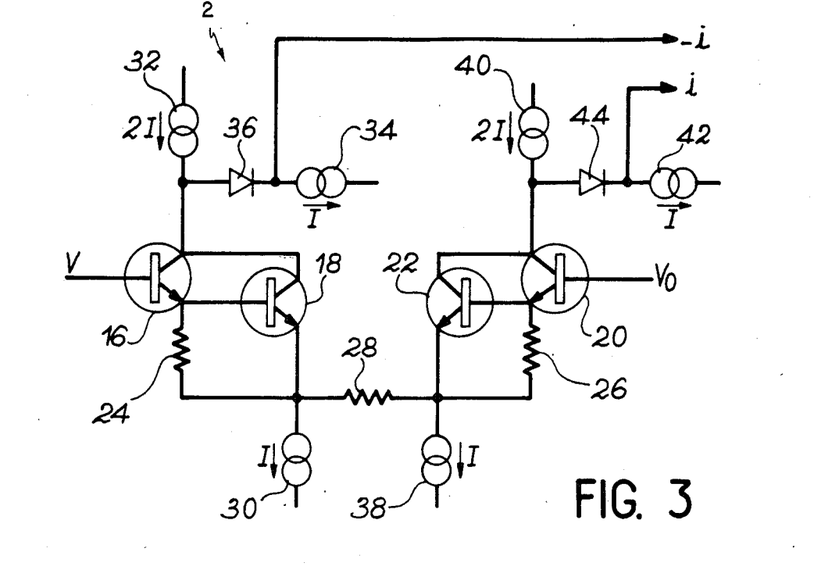
FIG. 3 an embodiment of the input stage of the converter of FIG. 1.

FIG. 3 shows an embodiment of the converter input stage 2. The latter comprises a first group of two Darlington-connected transistors 16, 18, the base of transistor 16 receiving the analog voltage signal V, a second group of two Darlington-connected transistors 20, 22, the base of transistor 20 receiving a reference voltage $V_0$. Two identical resistors 24, 26 respectively connect the emitters of transistors 16, 18 and the emitters of transistors 20, 22. A ressitor 28 also connects the emitters of transistors 18, 22. The current flowing through resistor 28 is the analog current i corresponding to the analog voltage V.

Current sources 30, 32, 34 are also provided on either side of transistors 16, 18 for transferring the current passing through resistor 28 to the collector of said transistor. The sum of these currents is zero, their sole function being to polarize the base - emitter junctions of the transistors in the correct direction. The current source 30 supplies a current −I to the emitters of transistors 16, 18. The current source 32 supplies a current 2I to the collectors of said transistors and current source 34 supplies a current −I.

A diode 36 is arranged between the collector of transistors 16, 18 and one output of the input stage in order to prevent the saturation of transistor 16. Diode 36 can either be formed by one or more diodes in series, or by a single Zener diode (which is reverse connected), with a view of obtaining a potential displacement between the intput of the first cell and the collectors of the transistors.

Symmetrically, a current source 38 supplies a current −I to the emitters of transistors 20, 22, a current source 40 supplies a current 2I to the collectors of transistors 20, 22 and a current source 42 supplies a current of intensity −I to another output of the input stage. A diode 44, identical to diode 36, is positioned between the collectors of transistors 20, 22 and said other input of the input stage.

The input stage shown in FIG. 3 makes it possible to convert an analog voltage signal V into an analog current i and its opposite −i as a function of the level of voltage V with respect to the range [$V_o-V_{ref}, V_o+V_{ref}$].

It is obvious that the invention is not limited to the case where the analog - digital converter has an input stage like that shown in FIG. 3 and, without passing beyond the scope of the invention, it is possible to use any other input stage converting an analog voltage signal into an analog current signal.

Figure 4:
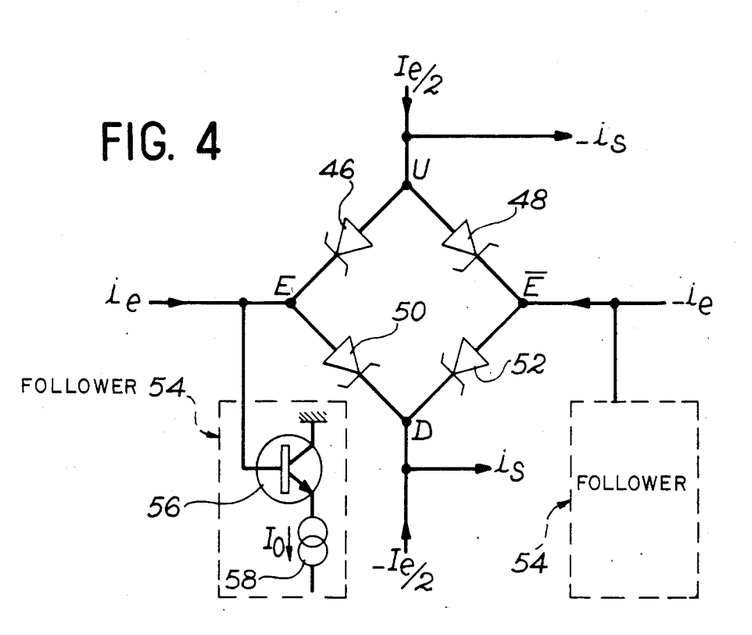
FIG. 4 an embodiment of a cell of the converter of FIG. 1.

FIG. 4 shows a first preferred embodiment of the comparison means of each cell of the analog - digital converter. This comparison means comprises a diode bridge 46, 48, 50, 52 and two follower means 54.

These diodes are preferably diodes having a low threshold voltage $V_S$, in order to limit the voltage swings. The diodes shown are of the Schottky type, whose threshold voltages on silicon is 0.4 V. The latter also provides a basis for the operation of existing devices on GaAs substrates.

The symmetrical input points of the diode bridges E and $\overline{E}$ respectively receive the current $i_e$ and the current $-i_e$. The high and low potential points U, D of the diode bridge constitutes the outputs of the comparison means. These points have fixed potentials $V_U$ and $V_D$. To the outputs are respectively supplied the analog currents $-i_s$ and $i_s$, which are respectively equal to $-|i_e|+I_e:2$ and $|i_e|-I_e:2$, the currents $I_e:2$ and $-I_e:2$ being supplied by the dividers associated with the cell.

For the terminal cell, which does not comprise any divider, the current $i_s$ and $-i_s$ applied are equal to $|i_e|$ and $-|i_e|$. These currents are not used. Only the sign of the current $i_e$ applied to the input of said cell is taken into accoutn. For each cell, the sign of current $i_e$ received is given by the potential of the input point E (or the input point $\overline{E}$), as stated in connection with FIG. 2.

The follower means 54 comprising a transistor 56 and current source 58 make it possible to apply the potentials of input points E and $\overline{E}$ to the inputs of the digital coder without disturbing the current at the input of the bridge.

The satisfactory operation of the diode bridge implies that the relation $V_U-V_D<2V_S$, in which $V_U$, $V_D$ and $V_S$ are respectively the potential at the high point U of the diode bridge, the potential at the low point D of the diode bridge and the threshold voltage of a diode of the bridge. It has been stated that the potential of the input point E could assume the two values $V_U-V_S$ and $V_D+V_S$. In a preferred manner and in order to limit the voltage swings, potential $V_U$ of the high point U is equal to potential $V_D$ of the low point D, increased by the potential $V_S$ of a diode. Thus, the potentials of the input point E (or input $\overline{E}$) are $V_D$ and $V_D+V_S$. The voltage swing is limited to $V_S$.

If in place of $V_U=V_D+V_S$, $V_U=V_D$ is chosen, the potentials of the input point E are $V_D-V_S$ and $V_D+V_S$. The voltage swing at the input point of the diode bridge is twice as large as in the previous case. The advantage of limiting the voltage swing is to permit the direct cascading of two cells without placing a linking means between them, which simplifies the construction of the converter and reduces its consumption. FIG. 5 shows two directly cascaded comparison means, without any linking means between them.

The first comparison means comprises a bridge of four diodes 60, 62, 64 and 66. The input point $E_1$ of this bridge receives curent $i_e$, while the symmetrical input point $\overline{E}_1$ receives the current $-i_e$. The upper and lower potential points $U_1$ and $D_1$ constitute the outputs of the cell and respectively receive the currents $I_e:2$ and $-I_e:2$. These two points are respectively connected to points $E_2$ and $\overline{E}_2$ of the diode bridge of the following comparison means.

The latter comprises four diodes 68, 70, 72 and 74 and receives on its input $E_2$ a current $-|i_e|+I_e:2$ and at its input $\overline{E}_2$ the opposite current. At its low point $D_2$, it supplies a current equal to the absolute value of the current rece3ived on its input points, i.e. $||i_e|-I_e:2|$ and supplies the opposite current at the high point $U_E$. The output currents $i_s$ and $-i_s$ are obtained by adding ($U_2$) and subtracting ($D_2$) the current $I_e:4$.

Each cell contributes on bit to the digital value of the analog voltage V to be digitized. The two cascaded cells in FIG. 5 consequently contribute two bits to this value. These two bits are represented by the potential of input point $E_1$ or input point $\overline{E}_1$, which can assume four values.

Thus, it can be seen in FIG. 4, that the potential at the input point of the diode bridge can assume the two following values $V_U-V_S$ and $V_D+V_S$, In the case of FIG. 5, the potentials are at high point $U_1$ and at low point $D_1$ can themselves assume two values, because they are connected to input points $E_2$ and $\overline{E}_2$ of the second diode bridge. The possible values of the high potential point $U_1$ are $V_{U2}-V_S$ and $V_{D2}+V_S$. The potential of the low point $D_1$ can assume the same two values. Thus, the four possible values of the potential of point $\overline{E}_1$ are: $V_{U2}-2V_S$, $V_{D2}$, $V_{U2}$, $V_{D2}+2V_S$.

The potentials of the input points $E_1$ and $\overline{E}_1$ are translated into two qudrivalued voltage signals by two follower means 54. It should be noted that it is difficult to place a follower means on the input point of the second diode bridge in bipolar technology, as a result of the uncompensated base current. This is not prejudicial and makes it possible to simplify the construction, whilst reducing consumption. In general terms, a follower means is only indispensible for cells following a linking means.

For limiting voltage swings, it is necessary to impose a potential difference $V_{U2}-V_{D2}$ equal to $V_S$. In this case, the extreme potentials of the input point $E_1$ differ by $3V_S$. Thus, the voltage swing is in this case three times greater than in the case of a single cell. Calculation shows that if it is wished to directly cascade three cells, the voltage swing at the input point of the first diode is $7V_S$, this voltage constraint being excessive. It can only be removed by using active cells transmitting the current of one cell to the following cell and without transmitting voltages.

Each linking means 8 (FIG. 1) comprises two current mirrors 9a, 9b, which fulfil this function. These current mirrors make it possible to transmit the analog current $i_s$ supplied by a cell and its opposite current. FIG. 6 shows a first embodiment of this current mirror.

This current mirror mainly comprises a diode 76, which receives on its anode (on its cathode in the case of a Zener diode) the current $i_s$ supplied by a cell and a transistor 78 functioning with a common base and whose emitter is connected to the cathode of the diode (the anode in the case of a Zener diode) and whose collector supplies the currnet $i_e$ received by the following cell. The diode makes it possible to compensate the voltage drop introduced by transistor 78. In another embodiment of the current mirrors, this drop is compensated by displacing the base potentials of the transistors 78. This solution makes it possible to eliminate diode 76, current source 78 and to reduce the current source 82 to value I.

The current mirror also comprises carrier current sources 80, 82, 84, the current source 80 supplying a current $+I$ to the anode (cathode in the case of a Zener diode) of diode 76, the current source 82 supplying a current $-2I$ to the emitter of transistor 78 and the current source 84 supplying a current $+I$ to the collector of said transistor. This simple emobdiment makes it possible to supply a current $i_e$ substantially equal to the current $i_s$ received at the input, whilst isolating the potentials from the upstream and downstream cells.

Thus, the current $i_e$ supplied is equal to the current $i_s$ reduced by the base current $i_b$ of transistor 78. The current mirror diagrammatically shown in FIG. 7 enables this interference current to be made quasi-constant it being compensated by the base current of the follower means. In the same way, the quasi-constant base currents of transistors 16 and 20 of the input stage are compensated by the follower means of the first cell.

In this drawing, the identical elements to those of FIG. 6 carry the same references. Compared with that of the preceding figure, the current mirror of FIG. 7 also has a transistor 86 and a resistor 88. The base of transistor 86 is connected to the emitter of transistor 78 and the collectors of the two transistors are interconnected. Resistor 88 connects the emitters of the two transistors.

The interest of this arrangement if that the voltage at the terminals of resistor 88 is quasi-constant it being the voltage $V_{be}$ between the base and emitter of transistor 86. In the case of silicon, this voltage if approximately 0.7 to 0.8 V. The current passing through resistor 88 and consequently transistor 78 is therefore also quasi-constant. Therefore, the current $i_b$ distributing the output of the current mirror is also quasi-constant.

On considering FIG. 5, it can be seen that part of the current $i_e$ received on input point $E_1$ of the diode bridge is applied to the base of transistor 56. To eliminate the disturbance due to the current $i_b$ of the current mirror of FIG. 7, it is merely necessary for the current reaching the base of transistor 56 (FIG. 5) to be equal to $i_b$. This is brought about with the current passing through resistor 88 being equal to the current source 58 connected to the emitter of transistor 56.

Thus, by merely adjusting the current source 58 with respect to resistor 88, the analog current received on the input point of a diode bridge of a cell is strictly equal to the analog current supplied by the diode bridge of the preceding cell. Moreover, if the base voltage of transistor 78 is fixed in such a way that it does not saturate the current mirror of the preceding cell, it is possible to eliminate diode 76. This Darlington-type connection is useless in the case of MOS or MES construction.

Figure 8:
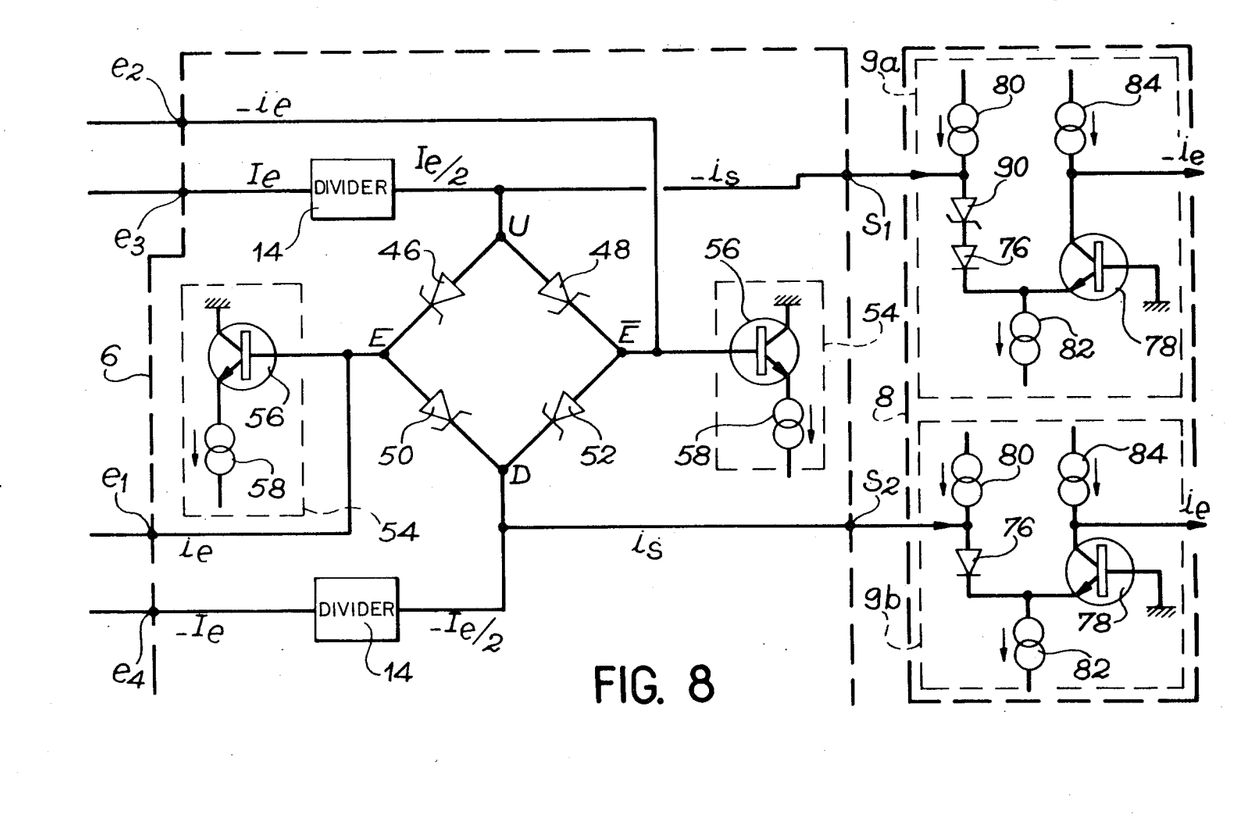
FIG. 8 the means for the zero comparison and obtaining of the absolute value of a cell connected to two current mirrors and to two follower means.

FIG. 8 illustrates an emobdiment of comparison means 12 of a cell and the relations between said comparison means and the current mirrors and the linking means.

Comparison means 12 is constituted by a diode bridge identical to that described in connection with FIG. 4 and two follower means 54 identical to those described with reference to FIGS. 4 and 5 and connected to each of the input points E and $\bar{E}$ of the diode bridge. It is obvious that the use of two follower means is not necessary, because the sought digital information corresponds both to the potential of input point E and to the potential of input point $\bar{E}$. However, the use of two follower means makes it possible to eleiminate the interference current $i_b$ supplied by either the current mirrors described with reference to FIG. 7, or by the transistors 16, 20 of the input stage in the case of the first cell.

The current mirrors 9a, 9b respectively receiving the current supplied by the high point U and the low point D of the diode bridge have already been described relative to FIGS. 6 and 7. It should be noted that a complementary diode 90 arranged in series with diode 76 has been added to the current mirror 9a connected to the high potential point U of the diode bridge, said diode 90 being of the same type as the bridge diodes. Diode 90 makes it possible to raise by a value $V_S$, the potential of the high point U of the bridge, so that there is a potential difference $V_U - V_D = V_S$ making it possible, as stated hereinbefore, to limit the voltage swings on the input points E and $\bar{E}$ of the diode bridge. For raising the potential of point U compared with point D, it is also possible to displace the base potentials of transistors 78 of the respective current mirrors.

The analog-digital converter described hereinbefore, can be produced both in bipolar technology and FET technology on Si or GaAs, or more generally, on any semiconductor substrate.

In FET technology, the gate current $i_G$ of the transistors is zero (Schottky current of $10^{-9}$A in inverse in MES and Tunnel current in MOS below $10^{-12}$A). There is then no need to combine a follower means with each current mirror, which is indispensible in bipolar technology. However, in said technologies, it is possible to combine a follower means with points $E_2$ and $\bar{E}_2$ of the double cell of FIG. 5.

What is claimed is:

1. A high speed analog-digital converter for converting an analog voltage signal V contained in a voltage interval $[V_o - V_{ref}, V_o + V_{ref}]$ into a digital value of N bits, wherein the converter comprises
   an input stage for converting the signal V into a current is which is a function of $V - V_o$ and for producing its opposite $-i$,
   a reference current source I which is a function of $V_{ref}$ and its opposite $-I$,
   $N-1$ identical cells in series, each cell comprising two current dividers, and means for zero comparison and obtaining the absolute value, said each cell receiving the currents $i_e$ and $I_e$ and their opposites $-i_e$ and $-I_e$ and supplying currents $i_s$ and $I_s$ respectively equal to $|i_e| - I_e:2$ and $I_e:2$ and their opposites $-i_s$ and $-I_s$,
   a terminal cell comprising means for the zero comparison and for obtaining the absolute value receiving a current $i_e$ and its opposite $-i_e$ and at least one follower means,
   a digital coder receiving the digital signals supplied by the cells and supplying a N binary signal $b_1 \ldots b_N$ representing the digitized value of the analog voltage signal V, and n connecting or linking means, in which $0 \leq n \leq N-1$, each of said connecting or linking means being positioned between two consecutive cells for transmitting the current $i_s$ supplied by one cell to the following cell, while isolating the potentials of the means for zero comparison and obtaining the absolute value of said cells.

2. An analog digital converter according to claim 1 wherein each of the $N-1$ identical cells comprises follower means receiving the digital signal supplied by the means for zero comparison and obtaining the absolute value and supplying a corresponding digital voltage signal.

3. An analog - digital converter according to claim 2, wherein the means for the zero comparison and for obtaining the absolute value of each cell comprises a diode bridge, whose high and low potential points are respectively at a fixed potential $V_U$ and $V_D$ with $V_U - V_D > 2 \cdot V_S$, in which $V_S$ is the threshold voltage of one diode of the bridge and whose input points respectively receive the current i and its opposite $-i$, the result of the zero comparison being indicated by the potential of an input point and the currents $|i|$ and $-|i|$ appearing respectively on the low and high potential points of the bridge.

4. An analog - digital converter according to claim 3, wherein each linking means comprises two current mirrors connected to the high potential point and to the low potential point of the diode bridge.

5. An analog - digital converter according to claim 4, wherein each current mirror has a transistor, whose emitter and collector respectively constitute the input and output.

6. An analog - digital converter according to claim 5, wherein each current mirror also comprises a second transistor in Darlington connection with the first transistor, a resistor being placed between the emitters of said transistors.

7. An analog - digital converter according to claim 5, wherein each current mirror also comprises a diode having a voltage drop between the current mirror input and the transistor emitter.

8. An analog - digital converter according to claim 7, wherein each current mirror also comprises a second transistor connected in Darlington manner with the first transistor, a resistor being placed between the emitters of said transistors.

9. An analog - digital converter according to claim 3, wherein it comprises a linking means between each cell of even order and the following cell.

10. An analog -digital converter according to claim 3, wherein each cell followed by a linking means comprises at least one follower means for supplying the digital coder with a voltage signal, which is a function of the potential of an input point of the means for zero comparison and obtaining the absolute value of said cell.

11. An analog - digital converter according to claim 3, wherein the potential difference $V_U - V_D$ between the high and low points of the diode bridge of each means for the zero comparison and obtaining of the absolute value is equal to the voltage threshold $V_S$ of one diode of the bridge.

12. An analog - digital converter according to claim 3, wherein each diode of the diode bridge of each means for the zero comparison and obtaining of the absolute value is a Schottky diode.

13. An analog - digital converter according to claim 3, wherein it also comprises at the input a sample and hold circuit.

14. An analog - digital converter according to claim 3, wherein it comprises $N-1$ linking or connecting means placed between the N cells.

* * * * *